(12) United States Patent
Habraken et al.

(10) Patent No.: US 6,903,261 B2
(45) Date of Patent: Jun. 7, 2005

(54) SOLAR CONCENTRATOR

(75) Inventors: Serge Habraken, Comblain-au-pont (BE); Jean-Marc Defise, Plainevaux (BE); Jean-Paul Collette, Embourg (BE)

(73) Assignee: Universite de Liege, Liege (BE)

( * ) Notice: Subject to any disclaimer, the term of this patent is extended or adjusted under 35 U.S.C. 154(b) by 0 days.

(21) Appl. No.: 10/477,522

(22) PCT Filed: May 17, 2002

(86) PCT No.: PCT/EP02/05561
§ 371 (c)(1),
(2), (4) Date: Nov. 20, 2003

(87) PCT Pub. No.: WO02/095838
PCT Pub. Date: Nov. 28, 2002

(65) Prior Publication Data
US 2004/0134531 A1 Jul. 15, 2004

(30) Foreign Application Priority Data
May 23, 2001 (EP) .......................... 01201938

(51) Int. Cl.$^7$ .................... H01L 31/052; F24J 2/08; F24J 2/16
(52) U.S. Cl. ................. 136/246; 136/259; 136/244; 136/251; 126/683; 257/436; 257/432; 257/433
(58) Field of Search .................. 136/246, 259, 136/244, 251; 126/683; 257/436, 432, 433

(56) References Cited

U.S. PATENT DOCUMENTS

| 4,143,234 A | 3/1979 | Johnson et al. ............ 136/259 |
| 4,238,246 A | * 12/1980 | Genequand et al. ........ 136/248 |
| 4,253,880 A | 3/1981 | Bellugue .................... 136/259 |
| 4,337,758 A | * 7/1982 | Meinel et al. .............. 126/684 |
| 4,653,472 A | * 3/1987 | Mori .......................... 126/683 |
| 4,723,535 A | 2/1988 | Lew ........................... 126/649 |
| 4,892,593 A | * 1/1990 | Lew ........................... 136/246 |
| 4,964,713 A | 10/1990 | Goetzberger ............... 350/629 |
| 6,528,716 B2 | * 3/2003 | Collette et al. ............. 136/246 |

FOREIGN PATENT DOCUMENTS

| DE | 4130753 A1 | 3/1993 |
| FR | 2549242 | 1/1995 |
| WO | WO90/04142 | 4/1990 |
| WO | WO 90/04142 A1 * | 4/1990 |
| WO | WO96/11501 | 4/1996 |

OTHER PUBLICATIONS

Collares–Pereira et al, Applied Optics, vol. 16, No. 10, Oct. 1977, pp. 1677–2683, Lens–mirror combinations with maximal . . . .

* cited by examiner

Primary Examiner—Alan Diamond
(74) Attorney, Agent, or Firm—Jacobson Holman PLLC

(57) ABSTRACT

A solar concentrator module comprising a front lens on its front face, a receiver cell on its rear face and a reflector between the front lens and the receiver cell, said reflector having inclined sidewalls along at least two opposite sides of the receiver cell characterised in that the reflectors are truncated and in that the sidewalls of the reflectors are inclined in such a way that, for a 0[deg] off-pointing, solar rays are reflected on the inclined side walls of the reflectors before impinging on the receiver cell, to produce a relatively uniform illumination on the receiver cell for a range of off pointing acceptance angle superior to zero degree.

14 Claims, 7 Drawing Sheets

Prior art (A) 0 deg (B) 3 deg (c) 3 deg (D) 3 deg (E) 3 deg (A)

3 deg (B)

3 deg

Side-wall Stiffeners

SOLAR CONCENTRATOR

This is a nationalization of PCT/EP02/05561 filed May 17, 2002 and published in English.

The present invention relates to a solar concentrator module. It is also relates to a Solar concentrator comprising a plurality of such modules and the method of assembling such modules.

It is particularly adapted to space environment but no restriction is made on adaptation to terrestrial applications.

Many studies are done on solar concentrator to improve solar radiation concentration upon solar cells.

M. Collares and Pereira in Applied Optics 16(10), 2677 (1977) described a lens-mirror combinations with maximal concentration. Collares and Pereira design comprises a combination of a refractive lens with a reflective mirror. Radiation converging at focus of a lens or Fresnel lens can be further concentrated by means of a suitable mirror. Collares concentrator requires that extreme incident rays at the aperture be also extreme rays at the absorber. The concentrator is determined by its acceptance angle and by a requirement that the extreme rays make no more than one reflection. The extreme rays are therefore firstly refracted by a lens and then reflected by a mirror The Collares and Pereira design is based on ideal non-imaging concentrator. It means that they have developed a mathematical relationship between geometrical parameters in order to reach a highest concentration factor (C) for a given off-pointing acceptance angle (alpha):

C=1/sin(alpha) for a one-dimensional concentrator

C=1/sin$^2$(alpha) for a two-dimensional concentrator

This type of concentrator procures a very high efficient (close to 100%) of light collection inside the limits of the acceptance angle (+alpha and −alpha). No care is taken for uniformity of the illumination on solar cells. So, collection efficiency is 100% but cells are not protected from hot spots. On the other hand, the collection quickly drops off to zero out of limits of the acceptance angle alpha.

Such hot spots also provides overheating problems in the concentrators with high concentration factors. Consequently solar cells performance is significantly reduced at high temperature, It is one of the various objects of the present invention to provide a concentrator allowing uniform illumination on a receiver cell.

We have now found that by truncation of the concentrator, we obtain a more uniform illumination on the receiver cell, as well as a reduction in thickness of the concentrator.

A solar concentrator module according to the present invention comprises a lens on his front face and an receiver cell on its rear face. Each receiver cell is at least partly surrounded by a reflector extending between the front lens and the receiver cell and being truncated (e.g. the concentrator height H is inferior to the lens focal length F) and the side walls of the reflector are inclined in such a way that, for a 0° off-pointing, solar rays are reflected on the inclined side walls of the reflector before impinging on the receiver so as to produce a relatively uniform illumination on the receiver cell for a range of off pointing acceptance angle superior to zero degree (e.g. between 0° and 3° or more).

By relatively uniform illumination of the receiver cell, it is meant that any hot spot likely to deteriorate the cell is avoided.

Truncation optimisation is not based on an analytical or mathematical relationship. The best way to find a truncation factor is to use a ray-tracing software and to modify geometry in an iterative way. So when increasing step by step the truncation factor, the lens focal length (F) and eventually the lens conic constant (CC), one can find an optimum value which is depicting illumination uniformity on the receiver cell (solar cell, for instance)

The concentrator may act in one direction (linear concentrator) or in both directions. For easiness of understanding, the mathematical relations below are expressed in the one direction case.

A receiver cell width (W) is related to a lens width (D) by the mathematical expression:

C=D/W where C is the concentration factor.

The lens focal length (F) is related to a concentrator height (H) inside a range for truncation accommodation: 0.6 F<H<0.9 F and more particularly: 0.6 F<H<0.88 F, and 0.7 F<H<0.8 F.

The lens can be flat or curved.

The ratio between the lens focal length (F) and the lens width (D) is in the range: 0.75<F/D<1.1 and more particularly 0.85<F/D<1

The reflector acting in between the lens and the receiver cell are oriented in such a geometry as to verify the following range: 25°<beta<40° and more particularly 30°<beta<35° where beta is the average obliquity of the side walls of the reflectors (exact obliquity for flat plane reflectors) with respect to the solar panel normal (see FIG. 6).

The concentrator height (H), the lens width (D) and the receiver width (W) allow for the determination of the reflector obliquity (beta):

$$\frac{D-W}{2H} = \text{Tan}(beta)$$

The reflector width (RW) is directly deduced from the concentrator height and the obliquity beta: RW=H/Cos(beta)

The conic constant CC of the lens curvature may be in the range: −3<CC≦0, and more particularly −3<CC<0, and −2.5<CC<−0.5

Where, as is known, CC is defined as to satisfy:

spherical shape when CC=0 paraboloid shape when CC=−1 hyperboloid shape when CC<−1

For each geometry of a concentrator module, there is an optimal value of conic constant CC which ensures a maximal uniformity of the illumination of the receiver cell.

The present invention is no more following the same mathematical relationship of Collares and al because of the truncation of the concentrator. The cut-off at the angle limit is no more abrupt. Collection efficiency is decreasing before the cut-off (this is the only drawback). The illumination can be optimised to remain relatively uniform. No hot spot is present.

This is an important improvement which insures survival of PV cell under concentration and a better efficiency of the cell.

The concentrator according to the invention has the advantage of being well-suited to concentration in one or both axis. The concentrator factor (C) can range from 2 to 10 on each axis but no restriction is made on larger concentration range.

Since space application requirement are 2 to 3 degree acceptance on the tracking axis without loss and no hot spot, our invention is perfectly suited for that purpose. In a non-tracking axis, any solar panel must accommodate seasonal variation (about 23.5 arc degrees) with no significant loss. This limits the concentration to small values on that axis. In one of the embodiments no concentration is produced on the related axis. However, the present invention is fully compatible with low concentration (<2.5:1) on a non tracking axis and medium concentration on a tracking axis (<15:1). This geometry is perfectly compatible with present requirements for spacecraft solar panel.

The overall thickness reduction of the solar concentrator by truncation of the reflectors is also a major advantage of the present invention.

In the preferred embodiment, for instance, the thickness is reduced of 15% compared to the prior art. Such reduction affects volume and weight of the solar panel which are physical parameters driving space solar panel technology.

Moreover, the module comprises only a front lens, side walls and a receiver cell, which avoids any additional optical element such as an additional rear lens to concentrate the rays on the receiver cell.

The receiver cell according to the invention is for example a solar cell such as photovoltaic cells, but may be any type of light absorber or receiver.

The receiver cells are generally mounted on a main supporting surface (CFRP or other, with additional electrically insulating layers), whose other side is directly facing the cold space, on the opposite of Sun direction. In this configuration, the cells are directly mounted on an efficient heat sink that pulls solar heat towards cold space.

There is no intermediate heat path as usually present when a radiating surface (radiating heat sink) is located on the other side of a sandwich honeycomb structure.

Indeed, the cooling radiating surface (heat sink) is equivalent to the collection surface, which tends to moderate temperature of the cells better than in configurations where the radiating surface is smaller or limited to the cell area.

The reflectors according to the invention are generally mirrors made of thin lightweight material. Such as AL, CFRP, Ni. The mirror may be coated with a reflective coating such as Al, Ag, or Au—. In a preferred embodiment, the reflector is made of Al with Ag coating. The Ag coating is protected by SiO2, Tio2 or MgF2 for space environment. Otherwise lightweight material may also be used such as thin film of polyimide.

The reflector may be flat or curved.

The reflectors themselves may be connected to a main supporting surface. They may be part of the heat sink to reduce the temperature of the receiver cell. Thus they provide a cool heat sink that will lower overheating of the cells.

The reflectors may be part of the mechanical structure of the panel They are part of a cellular mechanical structure such as honeycomblike The lens according to the invention is preferably a Fresnel lens.

Its shape may be flat or curved. Its optical function may incorporate aspherical curvature (conic constant relative to parabolic or elliptic shape)

The lens may be part of the mechanical structure They may be part of the mechanical structure such as an optical face sheet of the cellular structure.

Electrical hardware (cables for instance) may be accommodated behind the reflectors instead of, as usual, on an anti-sun-side of the solar panel.

Such accommodation provides a radiating heat sink surface free of harnesses, which tends to improve effective radiating area and cooling efficiency.

In a preferred embodiment the concentrator module, also comprises a flat perpendicular reflector at the center of the module. Such configuration improves the mechanical structure of the solar concentrator.

If concentration in both directions is used, a second flat perpendicular reflector may be added.

The invention also includes a solar concentrator comprising a plurality of modules and the method of assembling such modules.

Modules may be joined together by mechanical means (for instance but not exclusively by electron beam welding) or glued together. They may also be manufactured directly from a single piece as far as the reflectors are concerned; direct embossing of a metallic plate or electroforming may be used. The solar cells may be fixed by gluing on a back sheet or directly clamped on the reflector walls. The back sheet is typically a thin sheet of CFRP glued on the backside of the reflector sub-assemblies and whose radiative properties may be enhanced by a high emissivity coating (such as . . . ). The radiative properties of the back sheet may also be improved by the addition of a black coated honeycomb.

The optical face sheet (lens) may be made of a single piece or assembled from a mosaic of partial face sheets fixed directly on each concentrator module. In the case the face sheet is made of a single piece, it is fixed by gluing or mechanical means to the edges of the solar panel and to the edges of the modules to act as a stiffener of the whole panel. Since the face sheet is made of a transparent material (such as thin glass, silicone, polymer, . . . ), it does very slightly absorb incoming sun flux. Consequently, the face sheet temperature is lower than reflector and PV cell temperatures. In order to accommodate for sun and eclipse mode, the thermal differential deformations are managed by the choice of the materials (Coefficient of Thermal Expansion "CTE" matching and elasticity) and the assembly technique.

In a preferred embodiment, face sheet is made of stretchable silicone Fresnel lens. The tension of which is calculated to ensure good optical and structural behavior in the hot case (sun illumination). The very high CTE of the silicone (about 300 microns/m/deg) is partially compensated by the lower temperature is range from hot to cold case (eclipse), compared to PV cells and reflector structure.

In another embodiment, the face sheet is free from the edges of the concentrator modules to avoid thermomechanical stresses. It is attached only to the solar panel edges with adaptative mechanisms (springs, for instance) to accommodate the thermal differential expansion of the optical face sheet with respect to the panel structure. This embodiment is especially well-suited with rigid face sheet like plastic or glass material.

In order that the invention may become more clear there now follows a detailed description of 2 examples according to the invention. They are compared to the state of the art in FIG. 1

BRIEF DESCRIPTION OF DRAWINGS

In FIG. 1, the concentrator procures a very high efficient (close to 100%) of light collection inside the limits of the acceptance angle (+alpha and −alpha). At 0° off-pointing, the rays converge on the detectors without being submitted to a reflexion against the inclined side walls of the reflector. No care is taken for the uniformity of illumination of the solar cells. So, the collection efficiency is 100% but cells are not protected to hot spots. The collection quickly drops off to zero out the limits of the acceptance angle.

In FIG. 2 according to the invention, the illumination is optimised to remain relatively uniform. No hot spot is present. As can be seen from FIG. 2A, at 0° off-pointing, the rays converge on the reflectors after a reflexion against the inclined side walls of the reflectors, except for the rays located in the central region of the cells which directly impinge on the detectors.

PV cells are 5 mm wide (W=5 mm) and the module is 40 mm wide (D=40 mm). The geometric concentration factor is 8×. The lens focal length is 37.2 mm. Its conic constant CC is −1.7 (instead of 0 with Collares, Pereira et al). The lens is a flat Fresnel lens that is polished following the Fresnel lens etching with 5 micro-prisms per mm.

The height or thickness of the module is 28 mm. According to the design of Collares and Pereira et al., the thickness H should be 33.1 mm. The truncation to 28 mm is based on the optimization of the flux uniformity even when the sun light is not perfectly perpendicular to the solar panel (off-pointing occurs). This is a major improvement resulting from our invention. The reflector obliquity with respect to the concentrator normal is modified in accordance to the height reduction: β=32° instead of 27.9° following the Collares and Pereira theory.

Figure 2:
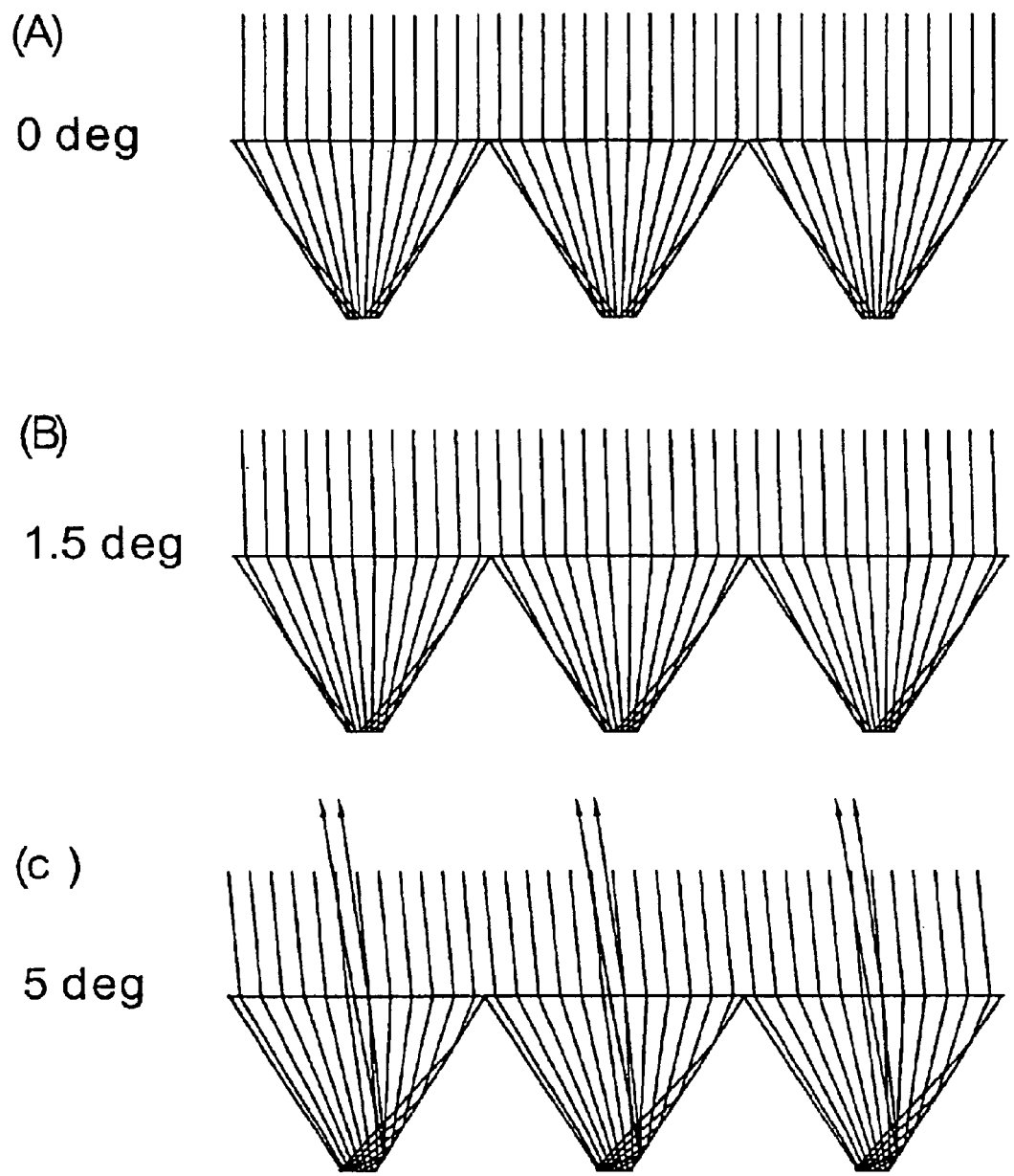
FIG. 2: solar concentrator of the present invention in a preferred embodiment:
(A) ray-tracing in the ideal case when no sun tracking error exists (off-pointing angle=0 degree),
(B) similar ray-tracing with 1.5 degree off-pointing,
(C) similar ray-tracing with 5 degree off-pointing showing collection loss,
(D) similar ray-tracing with 3 degree off-pointing,
(E) resulting flux distribution on the solar cells.
Figure 2:
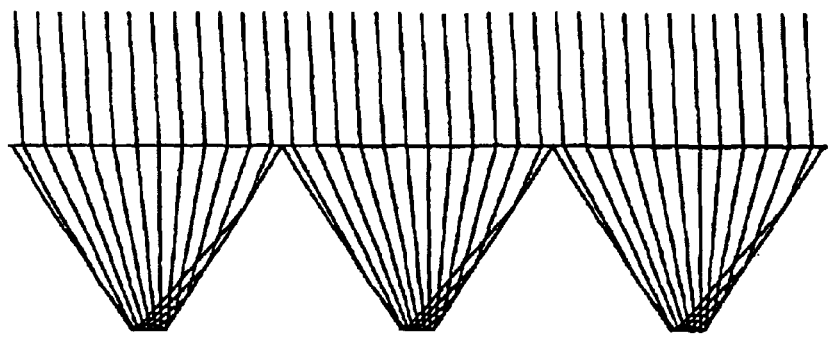
Figure 2:
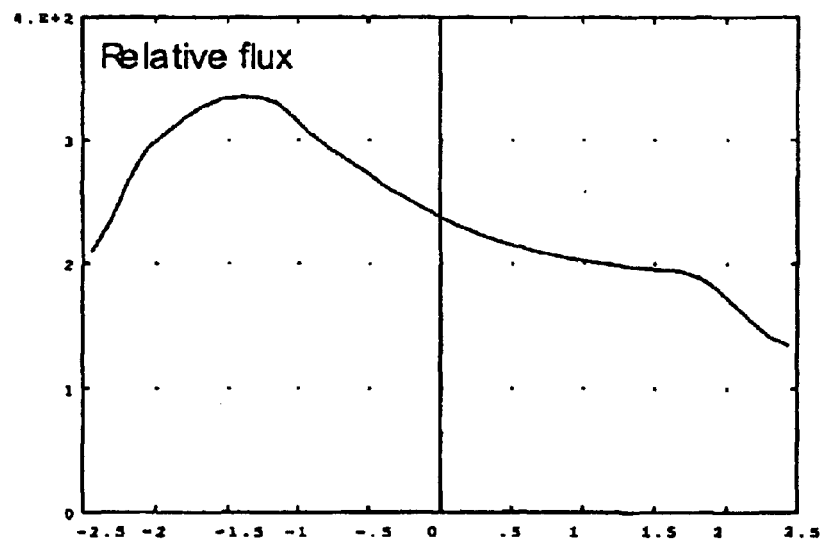

FIG. 2 depicts the behavior of the preferred embodiment when off-pointing occurs. The ray-tracing shows how rays of light are combined to keep the uniformity of illumination for 0, 1.5, 3, and 5 degree off-pointing. A rigorous calculation of the flux profile on the PV cells is proposed (3 degree off-pointing). The acceptance angle of the concentrator is high enough for solar application (no loss until 3.5 degrees off-pointing on the tracking axis and 15% loss at 5 degrees off-pointing). For the maximal contemplated off-pointing of 5° (FIG. 2C) the rays on one side (the left side in the drawing) do no longer reflect on the corresponding side wall, but they do on the other side (the right side in FIG. 2C).

Figure 1:
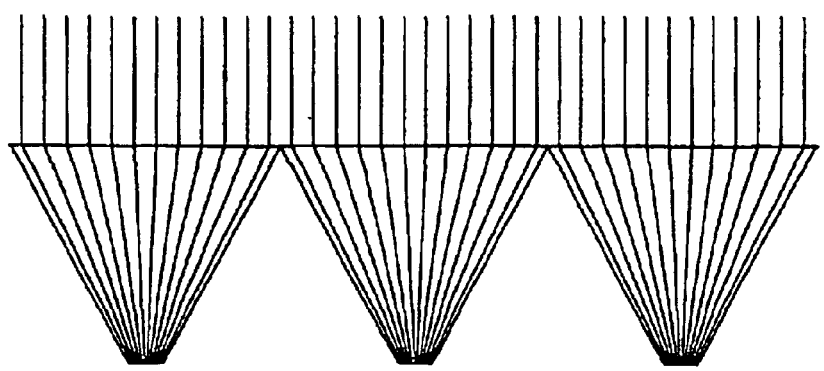
FIG. 1: prior art of combination according to Collares and Pereira of lens and reflector for solar concentration:
(A) ray-tracing in the ideal case when no sun tracking error exists (off-pointing angle=0 degree),
(B) similar ray-tracing with 3 degree off-pointing,
(C) resulting flux distribution on the solar cells.
Figure 1:
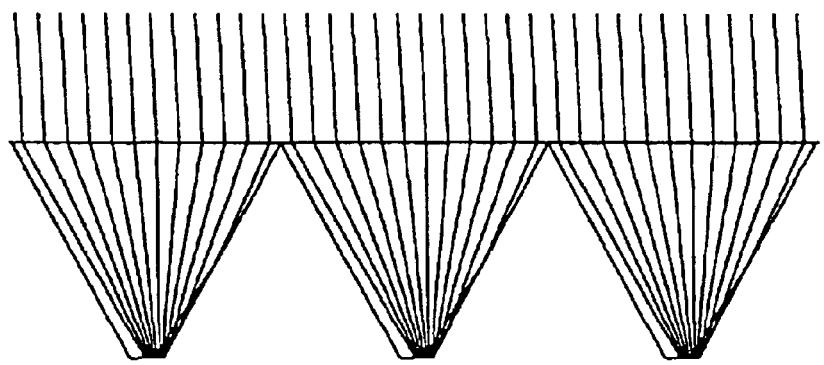
Figure 1:
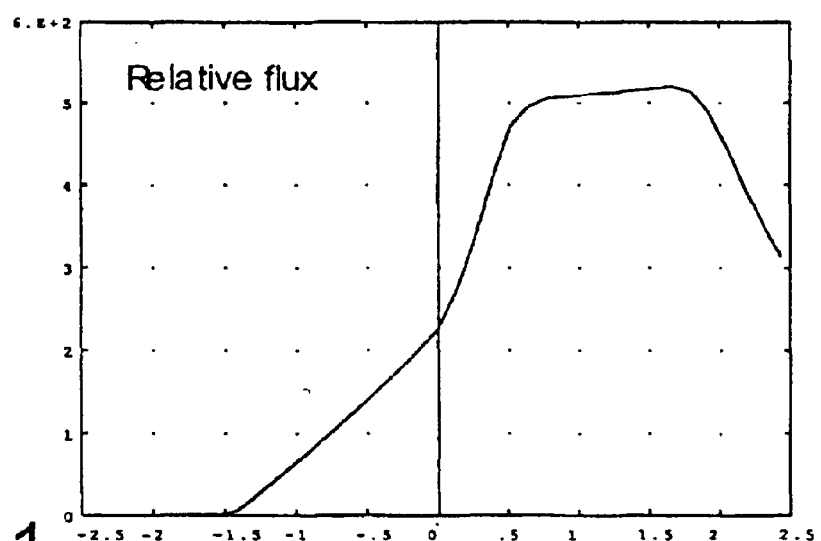

In the illustrated embodiment, performances for an off-pointing angle of 5° are the same as for a 3° off-pointing angle in prior art (FIG. 1B), but for an angle of 3° the repartition of the flux is incomparably better with the invention (FIGS. 2D and 2E) than in the prior art (FIGS. 1B and 1C).

Comparison with prior art (FIG. 1) is a clear evidence of the advantage. Even with an acceptance angle of 8 degrees (no loss until 8 degrees), the prior art shows very poor uniformity as soon as off-pointing occurs.

The preferred embodiment structure is also determined to reduce the overheating problems inherent to other concentrators with such concentration factors.

Performance of known solar cells is significantly reduced at high temperature, which tends to use solutions with low PV cell temperature to keep a higher PV efficiency.

Figure 3:
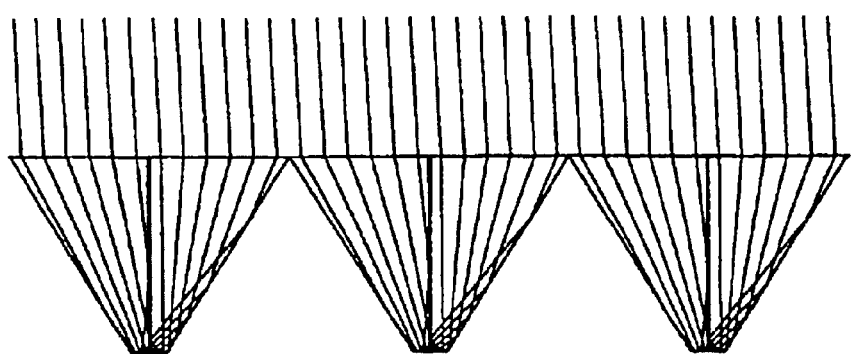
FIG. 3: solar concentrator of the present invention in another preferred embodiment including side-wall reflectors in the middle of the concentrator module for stiffness enhancement:
(A) ray-tracing with 3 degree off-pointing,
(B) resulting flux distribution on the solar cells.
Figure 3:
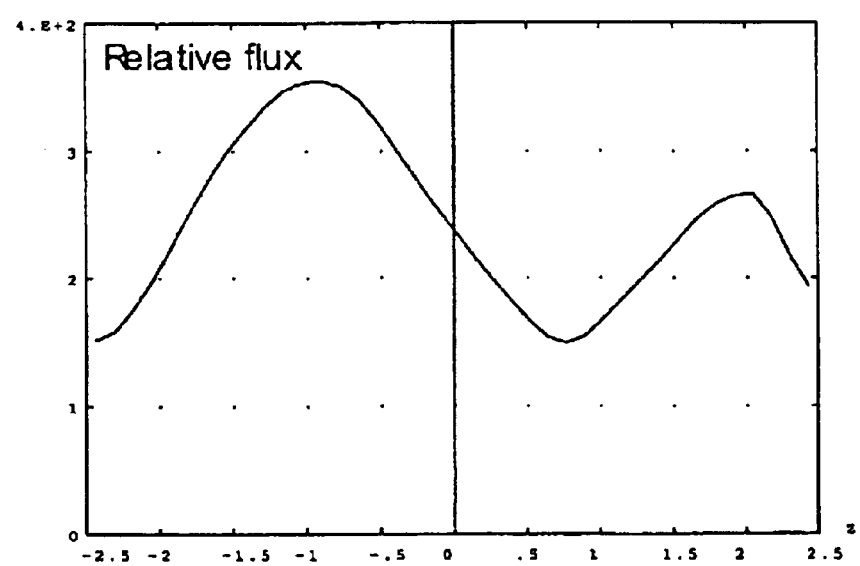

In FIG. 3 a side-wall reflector has been included in the middle of a concentrator module to help the structural design of the panel. The illumination uniformity is not pertubed as reported in the figure.

In another embodiment, the main supporting surface has been suppressed and the reflectors are used themselves as supporting structure (as usually does the sandwich honeycomb structure), supplying their own stiffness to the whole solar panel. In this embodiment, some additional stiffeners can be added, such as, but not exclusively, between the reflector walls (FIG. 3) so that they are not located in an area between the solar cells and the sun, but incorporated under the reflecting surfaces. The front face can also be used as a stiffening means of the panel.

Figure 4:
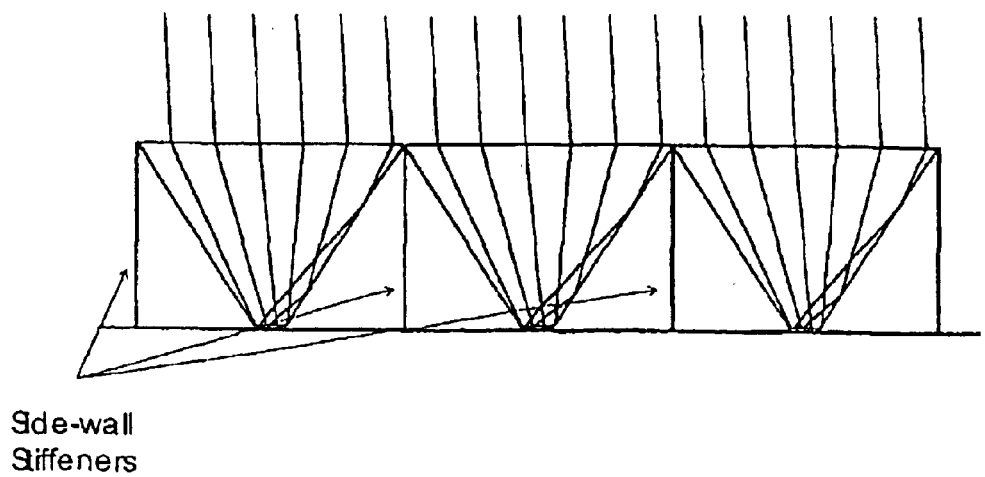
FIG. 4: solar concentrator of the present invention in another preferred embodiment including side-wall reflectors in the middle of the concentrator module and side-walls under the reflectors for stiffness enhancement.
Figure 6:
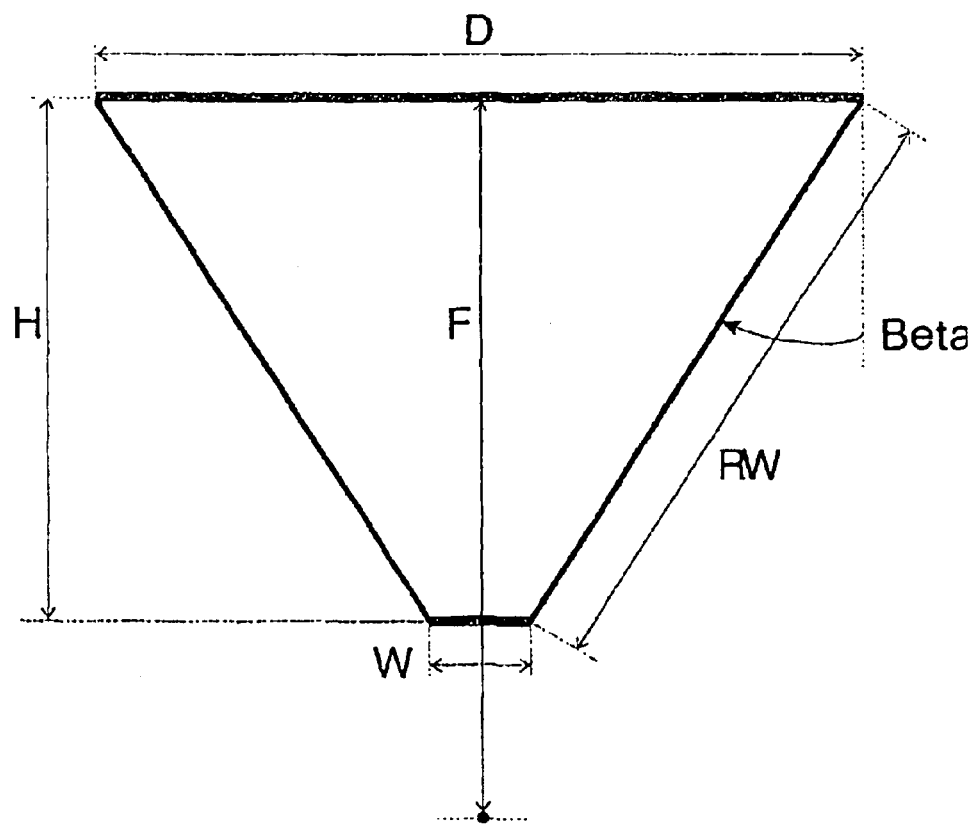
FIG. 6: geometry of one module according to the invention
Figure 5:
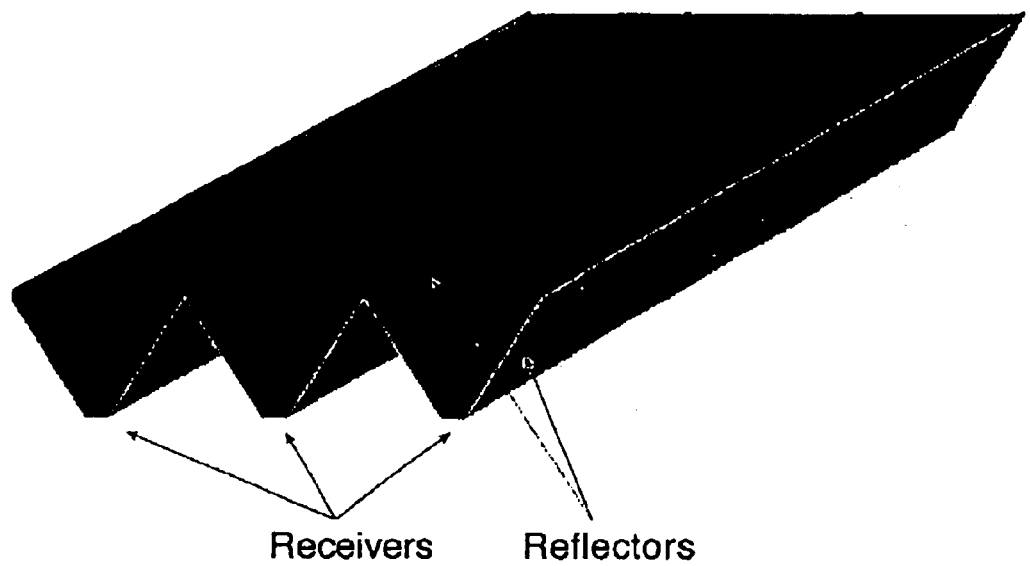
FIG. 5: several embodiments of the present invention showing the reflectors and stiffeners on a 3D model. The lens on the front side and the substrate sheet on the rear side are not shown for clarity purpose.
(A) 3D geometry of the embodiment depicted in FIG. 2.
(B) 3D geometry of the embodiment depicted in FIG. 2 where side-walls are added under the reflectors for stiffness enhancement.
(C) 3D geometry of the embodiment depicted in FIG. 4 with side-wall reflectors in the middle of the concentrator module and side-walls under the reflectors.
(D) Same geometry as FIG. 5C but low concentration in the other axis is added (bi-directional concentration) thanks to additional reflectors/stiffeners in the perpendicular direction.
Figure 5:
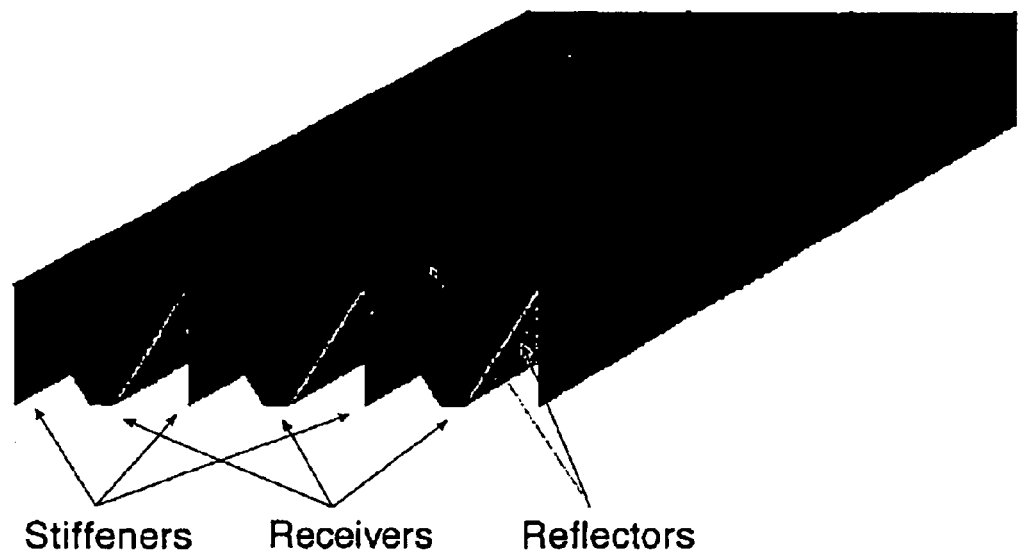
Figure 5:
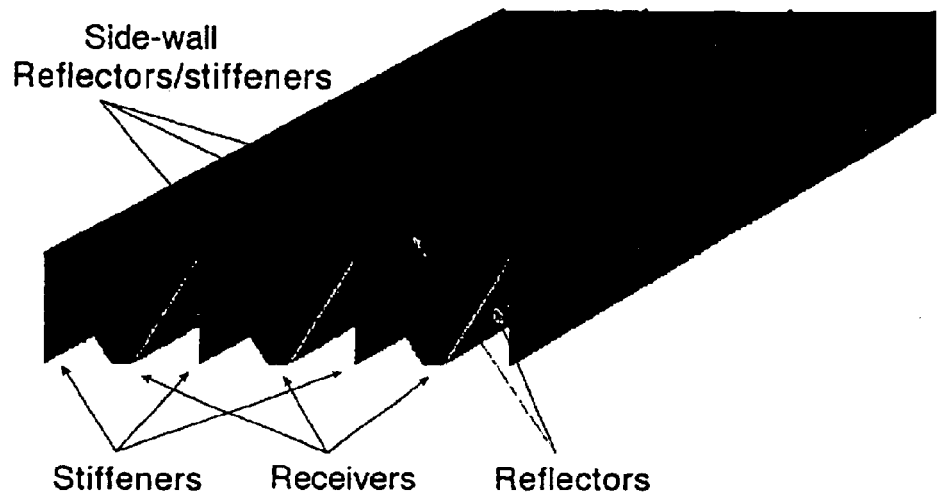
Figure 5:
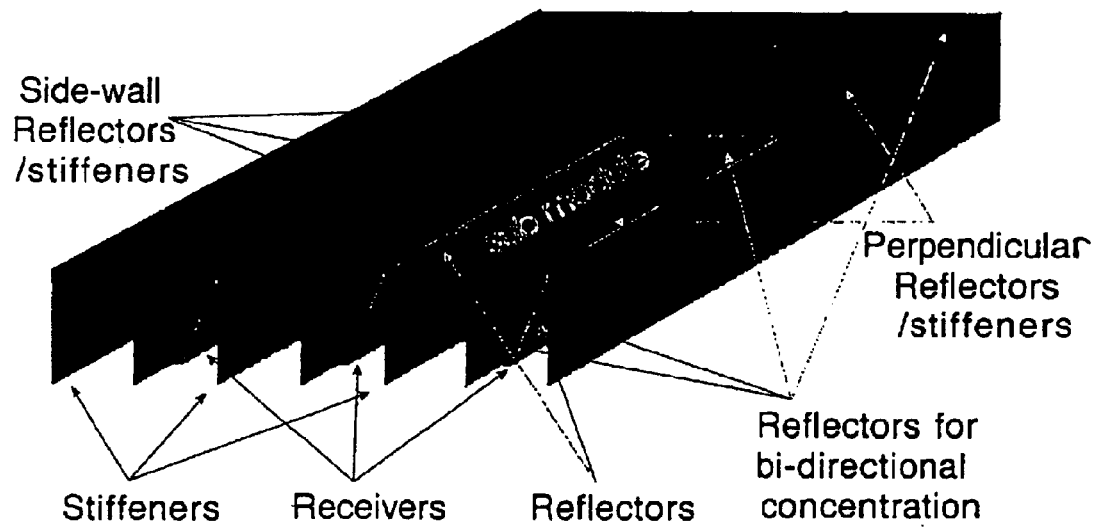

FIG. 5D shows the preferred embodiment for concentration on both axis. Stiffeners use the same geometry as FIG. 4. The front lens and the reflectors are adapted to produce concentration on both axis. Each sub module is made of four inclined reflectors, the lens, the receiver, and the optional stiffeners. Among the stiffeners, FIG. 5D shows crossed reflective side-walls (optional) laying on top of the receiver without degrading the light distribution on the receiver. Perpendicular stiffeners/reflectors are specific to concentration on the second axis.

What is claimed is:

1. A solar concentrator module comprising a front lens on its front face and a receiver cell on its rear face, a reflector between the front lens and the receiver cell, said reflector having inclined sidewalls along at least two opposite sides of the receiver cell, and a flat perpendicular reflector at the center of the module, characterised in that the reflectors are truncated to the extent that the ratio between the concentrator module height H and the focal length F of the lens is between 0.6 and 0.9 and in that said inclined sidewalls are inclined in such a way that, for a 0° off-pointing, solar rays are reflected on the inclined sidewalls of the reflector before impinging on the receiver cell, so that a relatively uniform illumination on the receiver cell occurs for a range of off pointing acceptance angle superior to zero degree.

2. The solar concentrator module according to claim 1, characterized in that the inclined sidewalls are planar.

3. The solar concentrator module according to claim 1 characterised in that the lens is a Fresnel lens.

4. The solar concentrator module according to claims 1, characterized in that the receiver cell has an elongated shape and in that said sidewalls are disposed at least along two longitudinal sides of the receiver cell.

5. The solar concentrator module according to claim 1 characterised in that the receiver cell is made of PV solar cells.

6. The solar concentrator module according to claim 1, characterized in that the ratio between the concentrator module height H and the focal length F of the lens is between 0.7 and 0.8.

7. The solar concentrator module according to claim 6, characterized in that the ratio between said focal length F and the lens width D is between 0.75 and 1.1.

8. The solar concentrator module according to claim 6, characterized in that the lens curvature has a conic constant CC chosen between 0 and −3 to maximize the uniformity of illumination of the receiver cell.

9. The solar concentrator module according to claim 1, characterized in that the average obliquity β of the sidewalls with respect to the receiver cell normal is between 25° and 40°.

10. The solar concentrator comprising a plurality of modules according to claim 1.

11. The solar concentrator according to claim 10 characterised in that it further comprise a flat stiffener between the concentrator modules that is perpendicular to the rear face of the concentrator modules and under the reflectors having inclined sidewalls.

12. The solar concentrator module according to claim 6, characterized in that the ratio between said focal length F and the lens width D is between 0.85 and 1.

13. The solar concentrator module according to claim 6, characterized in that the lens curvature has a conic constant CC chosen between −0.5 and −2.5 to maximize the uniformity of illumination of the receiver cell.

14. The solar concentrator module according to claim 1, characterized in that the average obliquity β of the sidewalls with respect to the receiver cell normal is between 30° and 35°.

* * * * *